US 11,183,531 B2

(12) United States Patent
Jin

(10) Patent No.: US 11,183,531 B2
(45) Date of Patent: Nov. 23, 2021

(54) DISPLAY SCREEN, DISPLAY MODULE, AND TERMINAL

(71) Applicant: Guangdong Oppo Mobile Telecommunications Corp., Ltd., Guangdong (CN)

(72) Inventor: Yong Jin, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 147 days.

(21) Appl. No.: 16/584,207

(22) Filed: Sep. 26, 2019

(65) Prior Publication Data
US 2020/0020737 A1 Jan. 16, 2020

Related U.S. Application Data

(63) Continuation of application No. PCT/CN2018/083042, filed on Apr. 13, 2018.

(30) Foreign Application Priority Data

Apr. 27, 2017 (CN) .......................... 201710289263.2

(51) Int. Cl.
*H01L 27/146* (2006.01)
*G06K 9/00* (2006.01)
(Continued)

(52) U.S. Cl.
CPC ...... *H01L 27/14678* (2013.01); *G06K 9/0004* (2013.01); *G06K 9/20* (2013.01);
(Continued)

(58) Field of Classification Search
CPC ..... H01L 27/124; H01L 27/14; H01L 27/146; H01L 27/14601; H01L 27/14603;
(Continued)

(56) References Cited

U.S. PATENT DOCUMENTS

2013/0287274 A1   10/2013   Shi et al.
2014/0218327 A1*  8/2014    Shi .......................... G06F 3/041
                                                                345/174
(Continued)

FOREIGN PATENT DOCUMENTS

CN   101183667 A   5/2008
CN   104850292 A   8/2015
(Continued)

OTHER PUBLICATIONS

"Touch panel with integrated fingerprint sensors based user identity management", Feng Tao et al; 2013 IEEE International Conference on Technologies for Homeland Security (HST), IEEE; pp. 154-160, XP032550157; dated Nov. 12, 2013.
(Continued)

*Primary Examiner* — Cheung Lee
(74) *Attorney, Agent, or Firm* — Young Basile Hanlon & MacFarlane, P.C.

(57) ABSTRACT

Provided are a display screen, a display module, and a terminal. The display screen includes a display layer. The display layer has a fingerprint recognition area. The fingerprint recognition area is provided with an array of transparent thin film transistors and a transparent medium among the transparent thin film transistors. The terminal includes the display screen described above, and further includes an optical fingerprint module and a frame. The display screen and the optical fingerprint module are fixed on the frame. The optical fingerprint module is on one side of the display screen away from a user of the display screen for display and located in a position corresponding to the fingerprint recognition area, so as to allow lights transmitted and received to pass through the fingerprint recognition area.

19 Claims, 6 Drawing Sheets

(51) Int. Cl.
*H01L 27/32* (2006.01)
*H01L 29/45* (2006.01)
*H01L 29/49* (2006.01)
*G06K 9/20* (2006.01)
*G06K 9/24* (2006.01)
*G06K 9/22* (2006.01)
*H01L 27/12* (2006.01)

(52) U.S. Cl.
CPC ............... *G06K 9/209* (2013.01); *G06K 9/22* (2013.01); *G06K 9/24* (2013.01); *H01L 27/14623* (2013.01); *H01L 27/14636* (2013.01); *H01L 27/3272* (2013.01); *H01L 27/3276* (2013.01); *H01L 29/45* (2013.01); *H01L 29/4908* (2013.01); *G06K 2009/0006* (2013.01); *H01L 27/124* (2013.01)

(58) Field of Classification Search
CPC ......... H01L 27/14623; H01L 27/14625; H01L 27/14678; H01L 27/14683; H01L 27/32; H01L 27/3206; H01L 27/3241; H01L 27/3244; H01L 27/3258; H01L 27/326; H01L 27/3262; H01L 27/3269; H01L 27/3272; H01L 27/3276; H01L 27/3297; G06K 9/0004; G06K 9/20; G06K 9/209; G06K 9/22; G06K 9/24
See application file for complete search history.

(56) References Cited

U.S. PATENT DOCUMENTS

| | | | |
|---|---|---|---|
| 2014/0292666 A1 | 10/2014 | Shi et al. | |
| 2015/0109214 A1 | 4/2015 | Shi et al. | |
| 2016/0132713 A1* | 5/2016 | Bae | G06K 9/0014 345/174 |
| 2017/0220844 A1* | 8/2017 | Jones | G06F 3/0421 |

FOREIGN PATENT DOCUMENTS

| | | |
|---|---|---|
| CN | 105702176 A | 6/2016 |
| CN | 105809141 A | 7/2016 |
| CN | 106022276 A | 10/2016 |
| TW | M532056 U | 11/2016 |
| WO | 2016114571 A1 | 7/2016 |

OTHER PUBLICATIONS

Extended European search report issued in corresponding European application No. 18790395.0 dated Feb. 3, 2020.
International search report issued in corresponding international application No. PCT/CN2018/083042 dated Jul. 18, 2018.
India First Examination Report for IN Application 201917038566 dated Feb. 16, 2021. (5 pages).
European Examination Application 18790395.0 dated Apr. 7, 2021 (6 pages).

* cited by examiner

DISPLAY SCREEN, DISPLAY MODULE, AND TERMINAL

CROSS-REFERENCE TO RELATED APPLICATION(S)

This application is a continuation of International Application No. PCT/CN2018/083042, filed on Apr. 13, 2018, which claims priority to Chinese Patent Application No. 201710289263.2, filed on Apr. 27, 2017, the disclosures of both of which are hereby incorporated by reference in their entireties.

TECHNICAL FIELD

This disclosure relates to the field of display technologies, and more particularly to a display screen, a display module, and a terminal.

BACKGROUND

In general, a fingerprint recognition module is disposed outside a display area of a display screen to avoid affecting display. However, under such structure, the screen-to-body ratio (that is, a ratio of the display area to the whole display screen) of the display area is small, which is not good for user experience. To avoid modifying the existing structure of an organic light-emitting diode (OLED) display screen, it has been proposed to arrange an optical fingerprint module under the OLED display screen. The optical fingerprint module is configured to recognize fingerprint signals by emitting lights to patterns of a finger and collecting lights reflected by the patterns. The display screen is provided with thin film transistors, and a source electrode ("source" for short), a gate electrode ("gate" for short), and a drain electrode ("drain" for short) of each thin film transistor are generally made from metal materials. Those electrodes made from the metal materials do not allow the lights to pass through and as a result, the display screen may have a low light transmittance, and only part of lights emitted from the terminal and part of lights reflected by the fingerprint and carrying fingerprint information are received by the display screen. As a result, the accuracy of fingerprint collection and fingerprint recognition is low, which affects the fingerprint recognition function of the terminal and the user experience.

SUMMARY

In implementations of the disclosure, a display screen, a display module, and a terminal are provided.

In implementations of the disclosure, a display screen is provided. The display screen includes a display layer. The display layer has a fingerprint recognition area. The fingerprint recognition area is provided with an array of transparent thin film transistors and transparent medium among the transparent thin film transistors. The transparent thin film transistors and the transparent medium are configured to allow lights transmitted or received by an optical fingerprint module to pass through.

In implementations of the disclosure, a display module is provided. The display module includes an optical fingerprint module and a display screen has a display layer, the display layer corresponding to a first area and a second area adjacent to the first area. The display layer corresponding to the first area is provided with an array of transparent thin film transistors and transparent medium among the transparent thin film transistors, the display layer corresponding to the second area is provided with an array of non-transparent thin film transistors, and the transparent thin film transistors and the transparent medium being configured to allow lights transmitted or received by the optical fingerprint module to pass through.

In implementations of the disclosure, a terminal is provided. The terminal includes a frame, a display screen, and an optical fingerprint module. The display screen is fixed on the frame and has a fingerprint recognition area and a peripheral area adjacent to the fingerprint recognition area. The display screen includes a display layer, the display layer corresponding to the fingerprint recognition area is provided with an array of transparent thin film transistors and transparent medium among the transparent thin film transistors, and the display layer corresponding to the peripheral area is provided with an array of non-transparent thin film transistors. The optical fingerprint module is fixed on the frame, disposed on one side of the display screen away from a surface of the display screen for display, and located in a position corresponding to the fingerprint recognition area, to allow lights transmitted and received to pass through the fingerprint recognition area.

BRIEF DESCRIPTION OF THE DRAWINGS

To describe the technical solutions of the implementations of the disclosure or the related art more clearly, the following will give a brief description of accompanying drawings used for describing the implementations of the disclosure or the related art. Apparently, the accompanying drawings described in the following are merely some implementations of the disclosure. Those of ordinary skill in the art can also obtain other accompanying drawings based on the accompanying drawings described below without creative efforts.

DETAILED DESCRIPTION

Technical solutions of implementations of the disclosure will be described in a clear and comprehensive manner in conjunction with the accompanying drawings.

Figure 1:
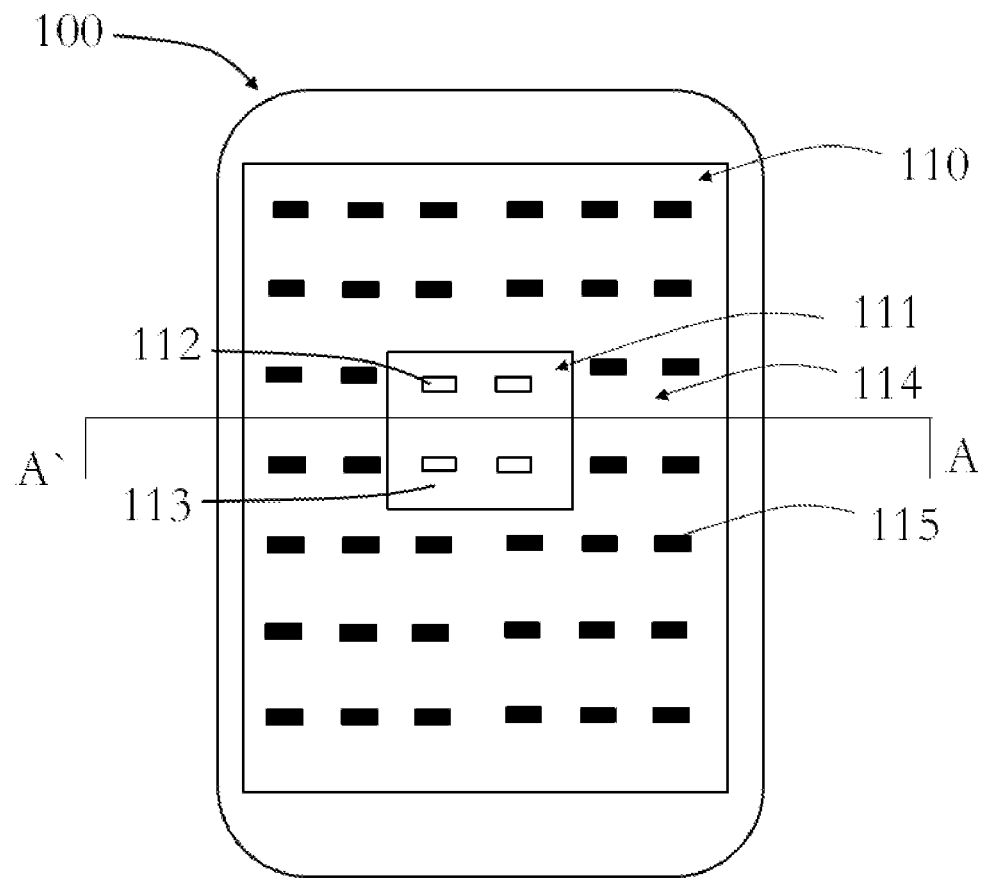
FIG. 1 is a schematic structural diagram illustrating a display screen according to an implementation of the disclosure.
Figure 2:
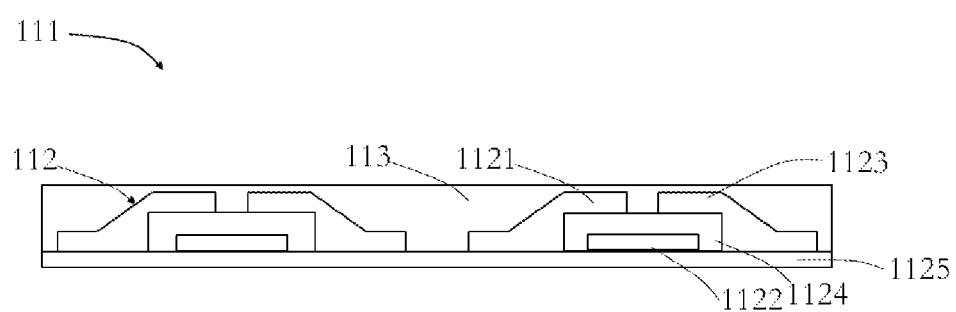
FIG. 2 is a schematic structural diagram illustrating thin film transistors according to an implementation of the disclosure.

FIG. 1 is a schematic structural diagram illustrating a display screen 100 according to an implementation of the disclosure. The display screen 100 includes a display layer 110 for image display. The display layer 110 has a fingerprint recognition area 111, and the fingerprint recognition area 111 is provided with an array of transparent thin film transistors 112 and transparent medium 113 among the transparent thin film transistors 112. In other words, the display layer 110 corresponding to the fingerprint recognition area 111 is provided with the array of transparent thin film transistors 112 and the transparent medium 113 among the transparent thin film transistors 112. As illustrated in FIG. 2, each transparent thin film transistor 112 includes multiple electrode layers (1121, 1122, 1123) and an insulation layer 1124 among the multiple electrode layers (1121, 1122, 1123). The multiple electrode layers (1121, 1122, 1123) and the insulation layer 1124 are made from transparent materials. The multiple electrode layers (1121, 1122, 1123) are implemented as a gate electrode 1122, a drain electrode 1121, and a source electrode 1123. The gate electrode 1122, the drain electrode 1121, the source electrode 1123, and the transparent medium 113 are made from transparent materials, to increase light transmittance of the fingerprint recognition area 111. The multiple electrode layers (1121, 1122, 1123) are made from at least one material selected from a group consisting of Indium Tin Oxide (ITO) thin film, Aluminium-doped zinc oxide (ZnO:Al) thin film, and Gallium-doped zinc oxide (ZnO:Ga) thin film. The fingerprint recognition area 111 is configured to allow lights transmitted or received by an optical fingerprint module to pass through, to increase light transmittance of the lights transmitted or received by the optical fingerprint module 202, thereby improving the accuracy of fingerprint recognition of the optical fingerprint module 202. The display layer 110 further has a peripheral area 114 adjacent to the fingerprint recognition area 111, and the peripheral area 114 is provided with an array of non-transparent thin film transistors 115. In other words, the display layer 110 corresponding to the peripheral area 114 is provided with the array of non-transparent thin film transistors 115.

For easy of understanding, the display layer is described as functionally having the fingerprint recognition area and the peripheral area. With a basic principle in mind that the display screen corresponding to the fingerprint recognition area is for fingerprint recognition, light induction, and the like, and the display screen corresponding to the peripheral area is not configured for fingerprint recognition, the fingerprint recognition area and the peripheral area can also be comprehended as areas of the display screen or a display module, which does not affect the basis of the present disclosure.

Figure 3:
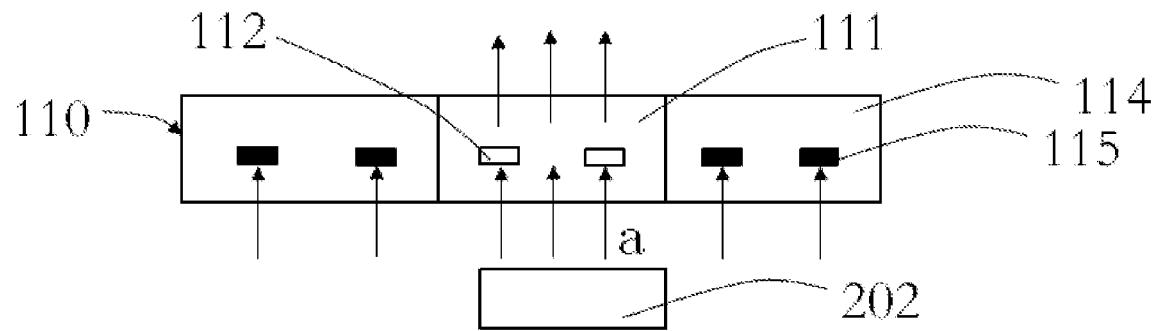
FIG. 3 is a cross-sectional view of the display screen illustrated in FIG. 1 along line AA'.

FIG. 3 is a cross-sectional view of the display screen 100 illustrated in FIG. 1 along line AA'. Since at least one electrode of the source electrode, the gate electrode, and the drain electrode of each non-transparent thin film transistor 115 is made from a metal such as Al, Mo, and Cu or an alloy thereof, the source electrode, the gate electrode, and/or the drain electrode of the non-transparent thin film transistor 115 do not allow light a to pass through. On the other hand, the gate electrode, the source electrode, and the drain electrode of each transparent thin film transistor 112 and the insulation layer 1124 among those electrodes are made from transparent materials and therefore, allow light a to pass through. As such, the light transmittance of the fingerprint recognition area 111 is larger than that of the peripheral area 114. Therefore, when the optical fingerprint module 202 is on one side of the display screen 100 away from a surface of the display screen for display, by providing the fingerprint recognition area 111 in the display screen 100, for the lights emitted from the optical fingerprint module 202 to the patterns of a finger, it is possible to reduce loss thereof in the display screen, thereby ensuring that more lights can be projected to and then reflected by the patterns of the finger; moreover, with the fingerprint recognition area 111, for lights reflected, the loss thereof in the display screen 100 can also be reduced, thereby ensuring that more lights can be projected onto the optical fingerprint module 202. The more the lights received by the optical fingerprint module 202, the higher the accuracy of the fingerprint recognition of the optical fingerprint module 202.

In one implementation, the fingerprint recognition area 111 may correspond to a part of the display layer 110. Alternatively, the fingerprint recognition area 111 may correspond to the whole display layer 110, in this case, the fingerprint recognition area correspond to whole image display area of the display screen 100.

Figure 4:
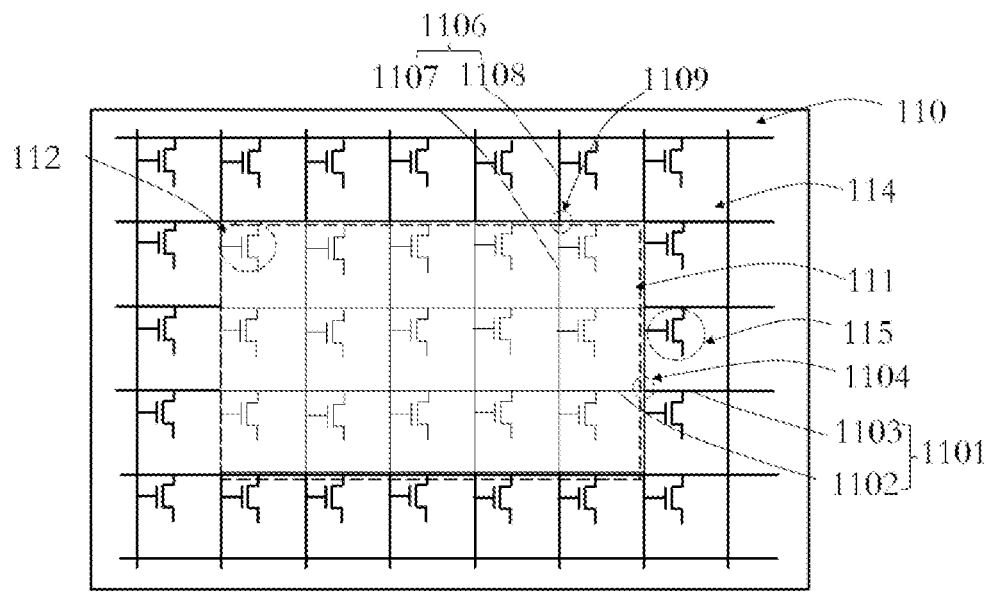
FIG. 4 is a schematic structural diagram illustrating a display screen according to a first implementation of the disclosure.
Figure 5:
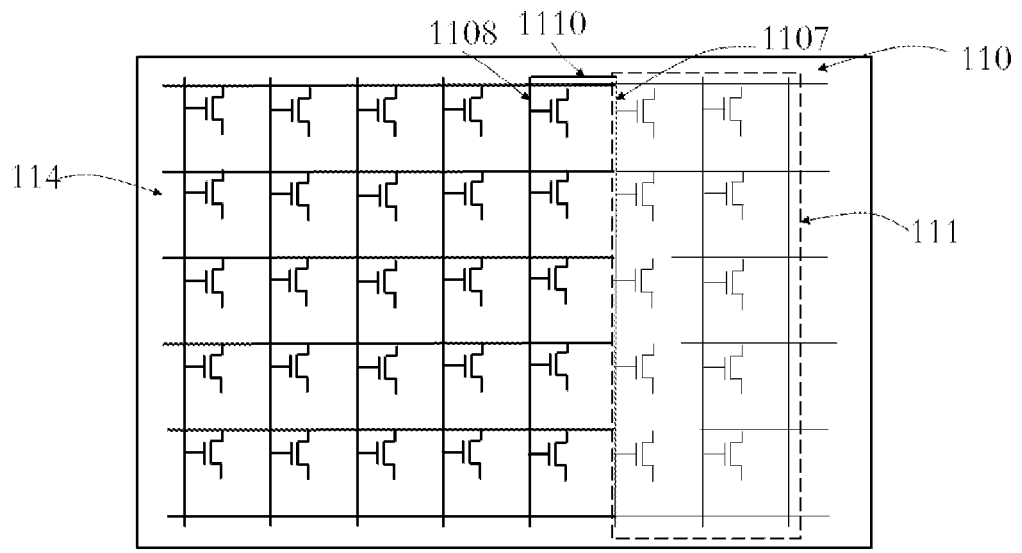
FIG. 5 is a schematic structural diagram illustrating a display screen according to a second implementation of the disclosure.

As illustrated in FIG. 4, the display layer 110 further includes multi-column scan lines (also known as gate lines) 1106, and the multi-column scan lines 1106 include at least one of transparent scan lines 1107 and non-transparent scan lines 1108 coupled with the transparent scan lines 1107. In one implementation, a column in the multi-column scan lines 1106 includes transparent scan lines 1107 and non-transparent scan lines 1108 coupled with the transparent scan lines, and a joint(s) 1109 between the transparent scan lines 1107 and the non-transparent scan lines 1108 are on the column of scan lines 1106. On the other hand, as illustrated in FIG. 5, the multi-column scan lines 1106 include multi-column transparent scan lines 1107 and multi-column non-transparent scan lines 1108 parallel to the multi-column transparent scan lines 1107, and joints between one column of transparent scan lines 1107 and an adjacent column of non-transparent scan lines 1108 are on electrical connection lines 1110 between the column of transparent scan lines 1107 and the adjacent column of non-transparent scan lines 1108. As illustrated in FIG. 5, part columns in the multi-column scan lines 1106 include multi-column transparent scan lines 1107, and remaining columns in the multi-column scan lines include multi-column non-transparent scan lines 1108 parallel to the multi-column transparent scan lines 1107. In one implementation, the transparent scan lines 1107 are in the fingerprint recognition area 111, coupled with gates of the transparent thin film transistors 112, and configured to allow lights transmitted or received by the optical fingerprint module 202 to pass through, thereby increasing light transmittance of the display screen 100. In one implementation, the non-transparent scan lines 1108 are in the peripheral area 114 and coupled with gates of the non-transparent thin film transistors 115.

Figure 6:
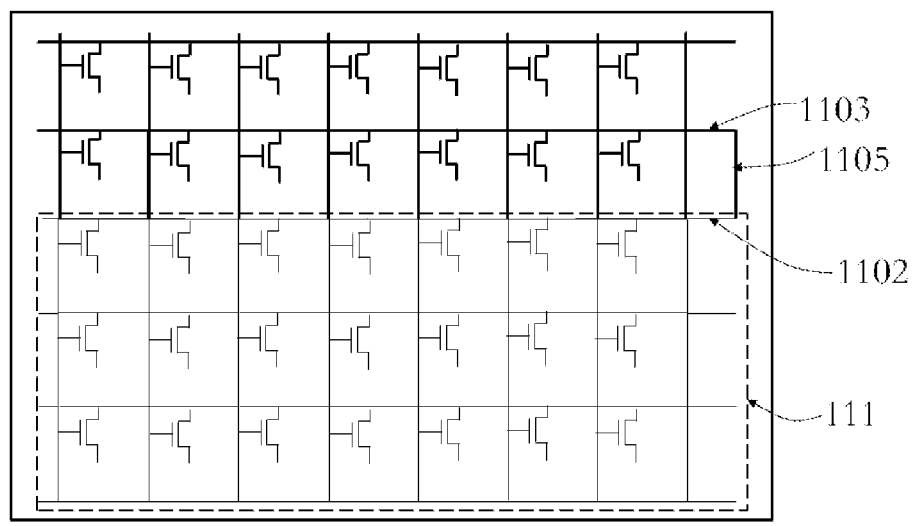
FIG. 6 is a schematic structural diagram illustrating a display screen according to a second implementation of the disclosure.

As illustrated in FIG. 4, the display layer 110 further includes multi-row data lines 1101. The extension direction of the multi-row data lines 1101 intersects the extension direction of the multi-column scan lines 1106. For example, the multi-row data lines 1101 are perpendicular to the multi-column scan lines 1106. In one implementation, the multi-row data lines 1101 include at least one of transparent data lines 1102 and non-transparent data lines 1103 coupled with the transparent data lines 1102. The transparent data lines 1102 are in the fingerprint recognition area 111. The transparent data lines 1102 coupled with sources of the transparent thin film transistors 112. The transparent data lines 1102 are configured to allow lights transmitted or received by the optical fingerprint module 202 to pass through, thereby increasing light transmittance of the display screen 100. In one implementation, the non-transparent data lines 1103 are in the peripheral area 114 and coupled with sources of the non-transparent thin film transistors 115. Similar to the scan lines, a row in the multi-row data lines 1101 includes transparent data lines 1102 and non-transparent data lines 1103 coupled with the transparent data lines 1102, and a joint(s) 1104 between the transparent data lines 1102 and the non-transparent data lines 1103 are on the row of data lines 1101. On the other hand, as illustrated in FIG. 6, the multi-row data lines 1101 include multi-row transparent data lines 1102 and multi-row non-transparent data lines 1103 parallel to the multi-row transparent data lines 1102, and joints between one row of transparent data lines 1102 and an adjacent row of non-transparent data lines 1103 are on electrical connection lines 1105 between the row of transparent data lines 1102 and the adjacent row of non-transparent data lines 1103. As illustrated in FIG. 6, part rows in the multi-row data lines 1101 include multi-row transparent data lines 1102, and remaining rows in the multi-row data lines include multi-row non-transparent data lines 1103 parallel to the multi-row transparent data lines 1102.

In order to smooth the fingerprint recognition area 111 and the peripheral area 114 and reduce structural difference between the thin film transistors 112 in the fingerprint recognition area 111 and the thin film transistors 115 in the peripheral area 114, the transparent scan lines 1107 and the non-transparent scan lines 1108 may have the same width and height. The transparent data lines 1102 and the non-transparent data lines 1103 may have the same width and height.

The gate electrode, the source electrode, and the drain electrode of the transparent thin film transistors 112 and the gate electrode, the source electrode, and the drain electrode of the non-transparent thin film transistors 115 are not restricted in structure or size. The gate electrode, the source electrode, and the drain electrode of the transparent thin film transistors 112 may have the same or different structure or size as the gate electrode, the source electrode, and the drain electrode of the non-transparent thin film transistors 115, which may be determined according to actual display needs.

There is no restriction on the position of the fingerprint recognition area 111. In one implementation, an orthogonal projection of the fingerprint recognition area 111 on the optical fingerprint module 202 covers the optical fingerprint module 202. In one example, the optical fingerprint module 202 corresponds to the fingerprint recognition area 111 in terms of position. For example, the optical fingerprint module 202 is located directly below the fingerprint recognition area 111 (in a thickness direction of the display screen 100, and the optical fingerprint module 202 is on one side of the display screen 100 away from the surface of the display screen for display). There is no restriction on the size of the fingerprint recognition area 111. For example, the size of the fingerprint recognition area 111 is larger than that of a light induction area of the optical fingerprint module 202. In one implementation, the fingerprint recognition area 111 may correspond to a part of the display layer 110. For example, the fingerprint recognition area 111 may be in a central area of the display layer 110, or may be in an edge area of the display layer 110. In another implementation, the fingerprint recognition area 111 may correspond to the whole display layer 110. The following will be detailed in specific implementations.

First Implementation

FIG. 4 is a schematic structural diagram illustrating a display screen 100 according to a first implementation of the disclosure. In one implementation, the fingerprint recognition area 111 corresponds to a part of the display layer 110. In one implementation, the fingerprint recognition area 111 is in a central area of the display layer 110, and is surrounded by the peripheral area 114. With such configuration. it is possible to adapt to a user's hand-held gesture, which facilitates the user to unlock with fingerprint, thereby improving user experience. For example, when a user tries to unlock a terminal with the terminal placed in a palm of his or her hand, since the location of the fingerprint of the thumb with respect to the terminal corresponds to a central area of the display layer 110, the terminal can be unlocked when the user simply put his or her thumb directly on the fingerprint recognition area 111 without moving the thumb.

Second Implementation

Figure 7:
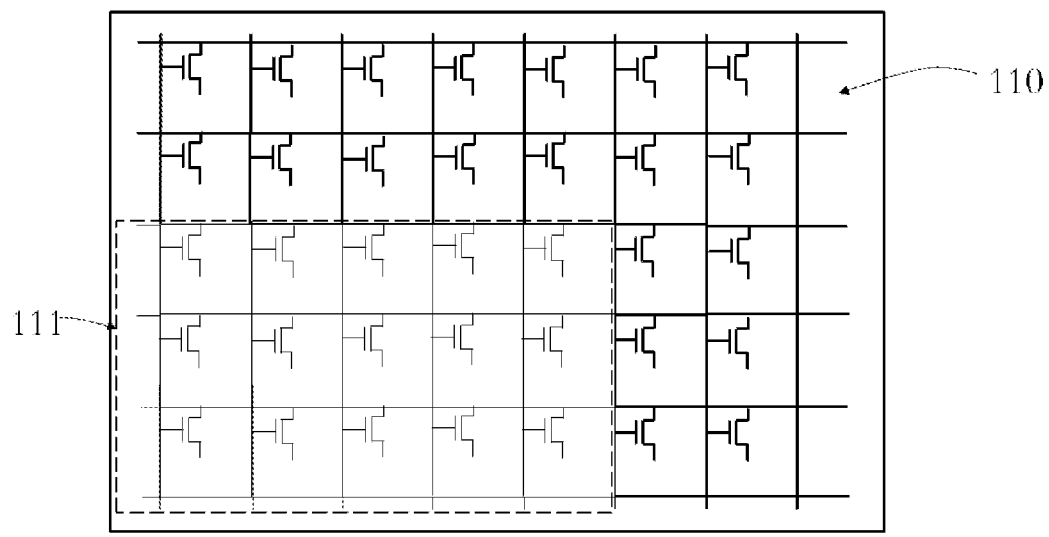
FIG. 7 is a schematic structural diagram illustrating a display screen according to a second implementation of the disclosure.

FIG. 5 to FIG. 7 are schematic structural diagrams illustrating a display screen 100 according to a second implementation of the disclosure. In one implementation, the fingerprint recognition area 111 may correspond to a part of the display layer 110 and may be in an edge area of the display layer 110. In one implementation, the peripheral area 114 is adjacent to the fingerprint recognition area 111. With such structural design, the transparent thin film transistors 112, the transparent scan lines 1107, and the transparent data lines 1102 can be disposed in the edge area of the display screen 100. Compared with the first implementation, in the second implementation, fewer joints are needed between the transparent scan lines 1107 and the non-transparent scan lines 1108 may be reduced, and also fewer joints are needed between the transparent data lines 1102 and the non-transparent data lines 1103, such that the risk of poor contact between the transparent scan lines 1107 and the non-transparent scan lines 1108 can be reduced, and the risk of poor contact between the transparent data lines 1102 and the non-transparent data lines 1103 can be reduced. As illustrated in FIG. 5, joints between one column of transparent scan lines 1107 and an adjacent column of non-transparent scan lines 1108 are located on electrical connection lines 1110 between the column of transparent scan lines 1107 and the adjacent column of non-transparent scan lines 1108. As illustrated in FIG. 6, joints between one row of transparent data lines 1102 and an adjacent row of non-transparent data lines 1103 are located on electrical connection lines 1105 between the row of transparent data lines 1102 and the adjacent row of non-transparent data lines 1103. Compared with the first implementation, as illustrated in FIG. 7, the joints between the column of transparent scan lines 1107 and the adjacent column of non-transparent scan lines 1108 is reduced, and the joints between the row of transparent data lines 1102 and the adjacent row of non-transparent data lines 1103 is also reduced.

Third Implementation

Figure 8:
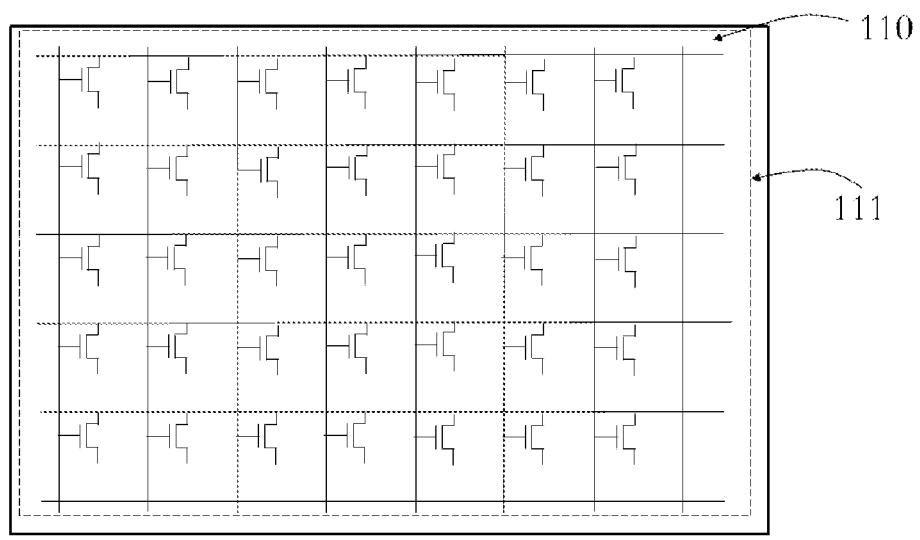
FIG. 8 is a schematic structural diagram illustrating a display screen according to a third implementation of the disclosure.

FIG. 8 is a schematic structural diagram illustrating a display screen 100 according to a third implementation of the disclosure. As illustrated in FIG. 8, the fingerprint recognition area 111 corresponds to the whole display layer 110. With such configuration, it is possible to increase an area for fingerprint recognition and reduce a risk of inaccuracy and/or failure of recognition due to poor finger placement. Furthermore, it is possible to reduce a risk of inaccuracy and/or failure of recognition due to existence of a foreign material in the fingerprint recognition area 111 of the display screen 100. As such, fingerprint recognition can be implemented in any area of the display layer 110, thereby improving the user experience.

Figure 9:
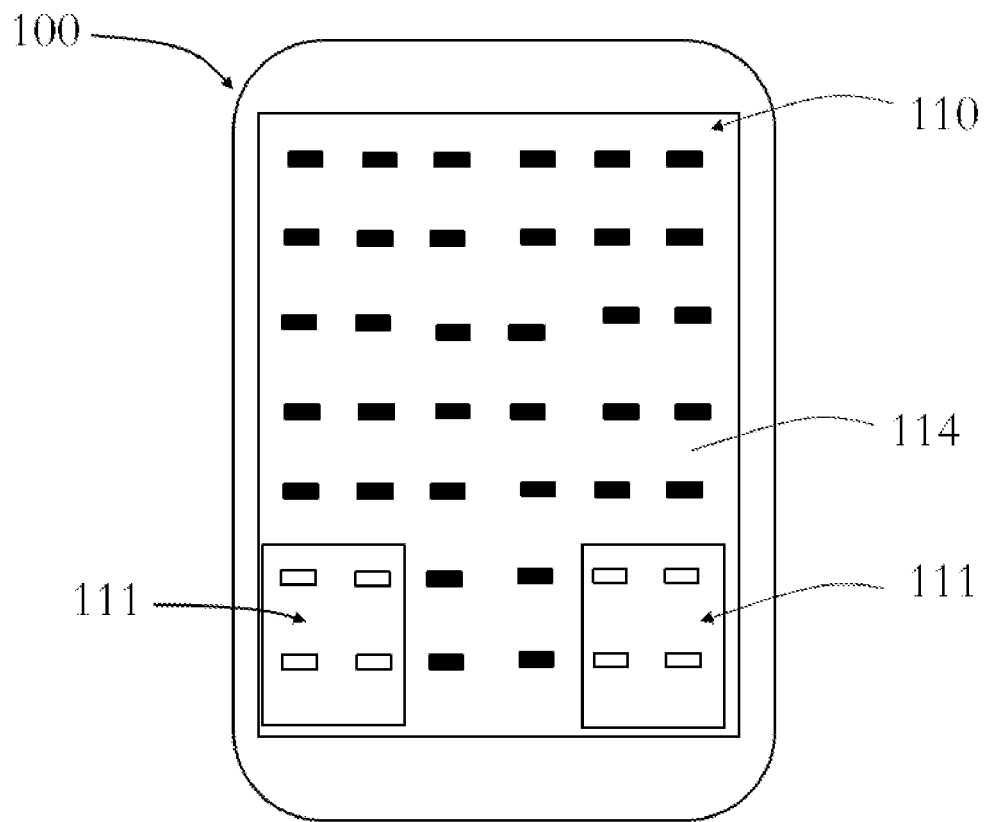
FIG. 9 is a schematic structural diagram illustrating a display screen according to an implementation of the disclosure.

There is no restriction on the number of the fingerprint recognition area 111. As illustrated in FIG. 9, the fingerprint recognition area 111 may be embodied as multiple fingerprint recognition areas. The multiple fingerprint recognition areas 111 are distributed in an area corresponding to the whole display layer 110. With such structural design, it is possible to reduce a risk of inaccuracy and/or failure of recognition due to existence of foreign materials in one or more of fingerprint recognition area 111 of the display screen 100. The fingerprint recognition can be implemented in any area of the display layer 110, thereby improving the user experience.

There is no restriction on the shape of the fingerprint recognition area 111. The fingerprint recognition area 111 can be circular, square, elliptical, irregular shape or the like.

As illustrated in FIG. 2 and FIG. 9, each transparent thin film transistor 112 includes the transparent source electrode 1121, the transparent gate electrode 1122, and the transparent drain electrode 1123, where the transparent source electrode 1121, the transparent gate electrode 1122, and the transparent drain electrode 1123 may be made from at least one material selected from a group consisting of ITO thin film, ZnO:Al thin film, and ZnO:Ga thin film or made from other transparent materials. The transparent medium 113 is disposed among the transparent thin film transistors 112. The transparent medium 113 is made from at least one material selected from a group consisting of Silicon dioxide (SiO2) thin film and Aluminum oxide ($Al_2O_3$) thin film or made from other transparent materials.

In one implementation, an insulation layer 1124 is disposed among the transparent source electrode 1121, the transparent gate electrode 1122, and the transparent drain electrode 1123. The insulation layer 1124 is made from SiO2 thin film, Al2O3 thin film, or other transparent insulation materials. For the transparent thin film transistor 112, the transparent gate electrode 1122 can be formed on a transparent substrate 1125 through a magnetron sputtering deposition and etching process, and then the transparent insulation layer 1124, the transparent source electrode 1121, and the transparent drain electrode 1123 can be formed on the transparent gate electrode 1122.

In one implementation, the transparent scan lines 1107 are made from at least one material selected from a group consisting of ITO thin film, ZnO:Al thin film, and ZnO:Ga thin film. In one implementation, the transparent data lines 1102 are made from at least one material selected from a group consisting of ITO thin film, ZnO:Al thin film, and ZnO:Ga thin film. In one example, the transparent scan lines 1107 and the transparent data lines 1102 may be formed through a magnetron sputtering deposition and etching process.

To reduce contact resistances between the transparent scan lines 1107 and the non-transparent scan lines 1108 as well as contact resistances between the transparent data lines 1102 and the non-transparent data lines 1103, the joints between the transparent scan lines 1107 and the non-transparent scan lines 1108 can be made from a transitional material, where the transitional material is a mixture of a material from which the transparent scan lines 1107 are made and a material from which the non-transparent scan lines 1108 are made. The joints between the transparent data lines 1102 and the non-transparent data lines 1103 can be made from a transitional material, where the transitional material is a mixture of a material from which the transparent data lines 1102 are made and a material from which the non-transparent data lines 1103 are made. For example, in case that the transparent scan lines 1107 are made from ITO thin film, and the non-transparent scan lines 1108 are made from Al metal, the joints between the transparent scan lines 1107 and non-transparent scan lines 1108 may be made from a mixture of the ITO thin film and the Al metal.

Figure 10:
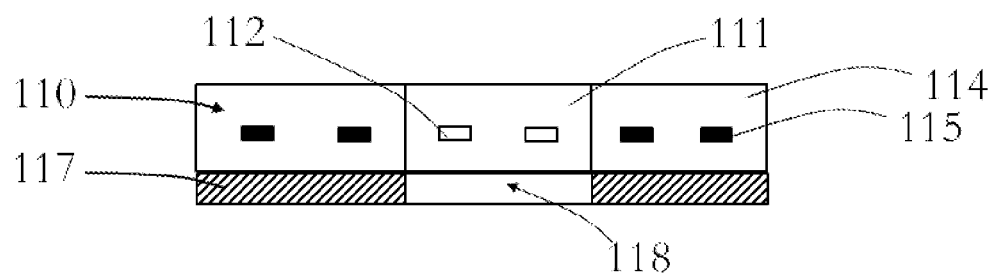
FIG. 10 is a schematic structural diagram illustrating a display screen according to an implementation of the disclosure.

As illustrated in FIG. 10, the display screen 100 further includes a light-shielding layer 117. The light-shielding layer 117 is disposed on one side of the display layer 110 away from the surface of the display screen for display and defines a through hole 118. In one implementation, the through hole 118 is located in a position corresponding to the fingerprint recognition area 111, whereby the optical fingerprint module 202 can transmit and receive lights through the fingerprint recognition area 111 and the through hole 118. In one implementation, the through hole 118 has a shape and size same as the fingerprint recognition area 111.

For example, the display screen 100 may be an organic light-emitting diode (OLED) display. For example, the display layer 110 is a luminescent layer. The light-shielding layer 117 is a foam layer. The foam layer is configured to block lights from passing through the display layer 110, to hide internal structures disposed under the display layer 110, and to exhibit a color of the light-shielding layer 117 when the display layer 110 emit lights (that is, in a screen-off state). The light-shielding layer 117 can be black, white, or other opaque colors. By defining the through hole 118 on the foam layer, lights may be allowed to pass through the light-shielding layer 117.

Figure 11:
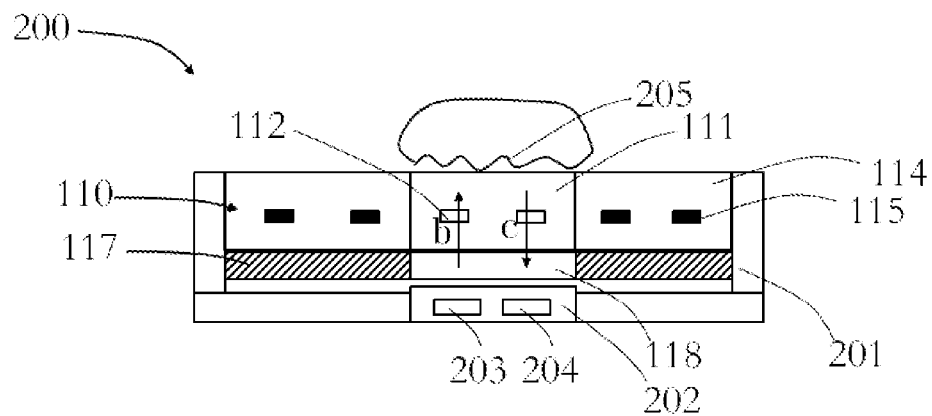
FIG. 11 is a schematic structural diagram illustrating a display device according to an implementation of the disclosure.

As illustrated in FIG. 11, FIG. 11 is a schematic structural diagram illustrating a display device 200 according to an implementation of the disclosure. The display device 200 includes the display screen 100 according to any of the implementations described above. In one implementation, the display device 200 further includes an optical fingerprint module 202 and a frame 201. In one implementation, the display screen 100 and the optical fingerprint module 202 are fixed on the frame 201, the optical fingerprint module 202 is located on one side of the display screen 100 away from the surface of the display screen for display, the optical fingerprint module 202 is located in a position corresponding to the fingerprint recognition area 111, to allow lights transmitted and received pass through the fingerprint recognition area 111. The optical fingerprint module 202 includes a light emitter 203 and a light inductor 204, the light emitter 203 is configured to emit induced light b and the light inductor 204 is configured to receive induced light c. When the finger is in contact with a surface of the display screen 100, lights emitted by the light emitter 203 form an incident light b and the incident light b is projected onto patterns 205 of a finger after sequentially passing through the through hole 118 and the fingerprint recognition area 111 of the display layer 110. Since the display layer 110 has the fingerprint recognition area 111, and the fingerprint recognition area 111 is provided with the transparent thin film transistors 112, the transparent medium 113 among the transparent thin film transistors 112, the transparent scan lines 1107, and the transparent data lines 1102, the light transmittance in the display layer 110 of the induced light b can be increased, thereby making the intensity of the incident light b projected onto the patterns 205 higher. As such, the intensity of reflected lights c formed from incident lights b reflected by the patterns 205 of the finger can also be increased. When reflected light c, which is formed from reflection of the patterns 205 of the finger, sequentially pass through the fingerprint recognition area 111 and the through hole 118 to be projected onto the light inductor 204, transmittance of the reflected light c in the fingerprint recognition area 111 of the display layer 110 can also be increased, and intensity of the reflected light c received by light inductor 204 may be increased, thereby improving accuracy of recognition of the optical fingerprint module 202.

Figure 12:
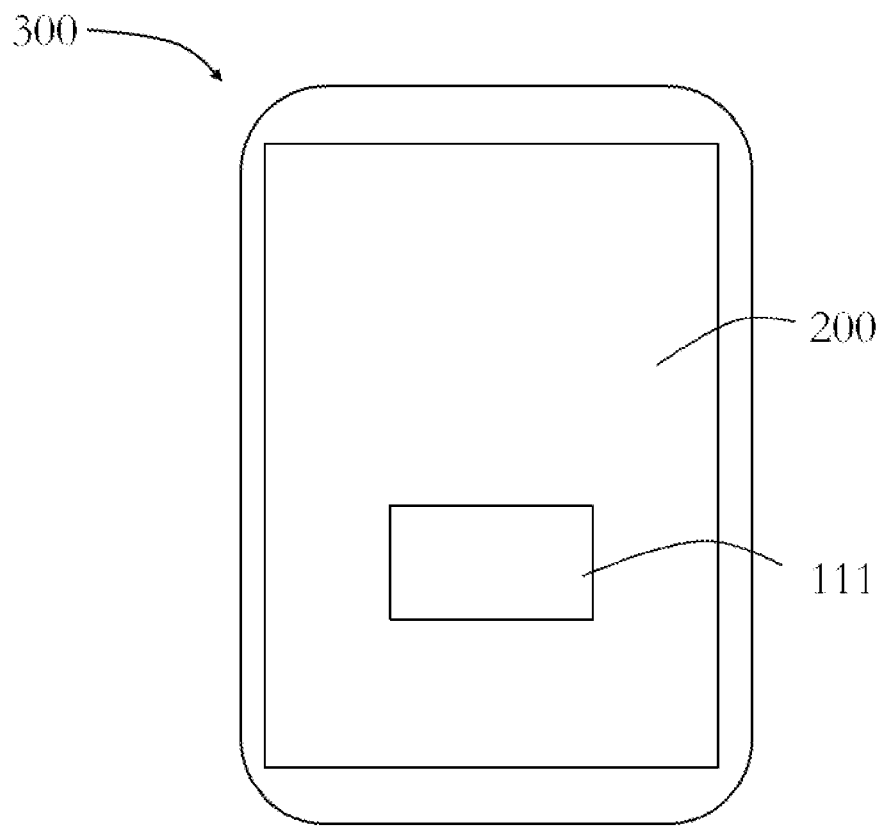
FIG. 12 is a schematic structural diagram illustrating a terminal according to an implementation of the disclosure.

As illustrated in FIG. 12, FIG. 12 is a schematic structural diagram illustrating a terminal 300 according to an implementation of the disclosure. The terminal 300 includes the display device 200. The display device 200 includes a display screen 100 and an optical fingerprint module 202 disposed on one side of the display screen 100 away from the surface of the display screen for display. The display screen 100 has a fingerprint recognition area 111. Since the fingerprint recognition area 111 is provided with the array of transparent thin film transistors 112 and transparent medium 113 among the transparent thin film transistors 112, light transmittance of the fingerprint recognition area 111 can be increased. The optical fingerprint module 202 is located in a position corresponding to the fingerprint recognition area 111, such that the intensity of the lights emitted from the optical fingerprint module 202 to the patterns 205 may be increased, and accordingly the intensity of the induced light reflected by the patterns 205 may be increased, thereby improving the accuracy of fingerprint recognition of the optical fingerprint module 202.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A display screen, comprising a display layer and a peripheral area, the display layer having a fingerprint recognition area, the fingerprint recognition area being provided with an array of transparent thin film transistors and transparent medium among the transparent thin film transistors, the transparent thin film transistors and the transparent medium being configured to allow lights transmitted or received by an optical fingerprint module to pass through, the peripheral area is adjacent to the fingerprint recognition area, and the peripheral area is provided with an array of non-transparent thin film transistors.

2. The display screen of claim 1, wherein each transparent thin film transistor comprises a plurality of electrode layers and an insulation layer among the plurality of electrode layers, the plurality of electrode layers and the insulation layer are made from transparent materials.

3. The display screen of claim 2, wherein the plurality of electrode layers are implemented as a gate, a drain, and a source; wherein the gate, the drain, and the source are made from transparent materials.

4. The display screen of claim 1, wherein the display layer further comprises multi-column scan lines, and the multi-column scan lines comprises transparent scan lines and non-transparent scan lines coupled with the transparent scan lines; wherein the transparent scan lines are in the fingerprint recognition area, coupled with gates of the transparent thin film transistors, and configured to allow lights transmitted or received by the optical fingerprint module to pass through; wherein the non-transparent scan lines are in the peripheral area and coupled with gates of the non-transparent thin film transistors.

5. The display screen of claim 4, wherein a column in the multi-column scan lines comprises transparent scan lines and non-transparent scan lines coupled with the transparent scan lines, and joints between the transparent scan lines and the non-transparent scan lines are on the column of scan lines.

6. The display screen of claim 5, wherein the joints between the transparent scan lines and the non-transparent scan lines are made from a transitional material, and the transitional material is a mixture of a material from which the transparent scan lines are made and a material from which the non-transparent scan lines are made.

7. The display screen of claim 4, wherein the multi-column scan lines comprise multi-column transparent scan lines and multi-column non-transparent scan lines parallel to the multi-column transparent scan lines, and wherein joints between one column of transparent scan lines and an adjacent column of non-transparent scan lines are on electrical connection lines between the column of transparent scan lines and the adjacent column of non-transparent scan lines.

8. The display screen of claim 1, wherein the display layer further comprises multi-row data lines, and the multi-row data lines comprise transparent data lines and non-transparent data lines coupled with the transparent data lines, wherein the transparent data lines are in the fingerprint recognition area, coupled with sources of the transparent thin film transistors, and configured to allow lights transmitted or received by the optical fingerprint module to pass through, and wherein the non-transparent data lines are in the peripheral area and coupled with sources of the non-transparent thin film transistors.

9. The display screen of claim 8, wherein a row in the multi-row data lines comprises transparent data lines and non-transparent data lines coupled with the transparent data lines, and joints between the transparent data lines and the non-transparent data lines are on the row of data lines.

10. The display screen of claim 9, wherein the joints between the transparent data lines and the non-transparent data lines are made from a transitional material, and the transitional material is a mixture of a material from which the transparent data lines are made and a material from which the non-transparent data lines are made.

11. The display screen of claim 8, wherein the multi-row data lines comprise multi-row transparent data lines and multi-row non-transparent data lines parallel to the multi-row transparent data lines, and wherein joints between one row of transparent data lines and an adjacent row of non-transparent data lines are on electrical connection lines between the row of transparent data lines and the adjacent row of non-transparent data lines.

12. The display screen of claim 1, wherein an orthogonal projection of the fingerprint recognition area on the optical fingerprint module covers the optical fingerprint module.

13. The display screen of claim 1, wherein the fingerprint recognition area corresponds to a part of the display layer, and wherein the fingerprint recognition area is in a central area of the display layer and is surrounded by the peripheral area.

14. The display screen of claim 1, wherein the fingerprint recognition area corresponds to a part of the display layer and is in an edge area of the display layer.

15. The display screen of claim 1, wherein the fingerprint recognition area corresponds to the whole display layer.

16. The display screen of claim 1, further comprising a light-shielding layer, wherein the light-shielding layer is disposed on one side of the display layer away from a surface of the display screen for display and defines a through hole, wherein the through hole is located in a position corresponding to the fingerprint recognition area, wherein the optical fingerprint module is configured to transmit and receive lights through the fingerprint recognition area and the through hole.

17. The display screen of claim 16, wherein the through hole has a shape and size same as the fingerprint recognition area.

18. A display module, comprising an optical fingerprint module and a display screen having a first area and a second area adjacent to the first area; the display screen having a display layer, the display layer corresponding to the first area being provided with an array of transparent thin film transistors and transparent medium among the transparent thin film transistors, the display layer corresponding to the second area being provided with an array of non-transparent thin film transistors, and the transparent thin film transistors and the transparent medium being configured to allow lights transmitted or received by the optical fingerprint module to pass through.

19. A terminal, comprising:
a frame;
a display screen, fixed on the frame and having a fingerprint recognition area and a peripheral area adjacent to the fingerprint recognition area, the display screen comprising a display layer, the display layer corresponding to the fingerprint recognition area being provided with an array of transparent thin film transistors and transparent medium among the transparent thin film transistors, and the display layer corresponding to the peripheral area being provided with an array of non-transparent thin film transistors; and
an optical fingerprint module, fixed on the frame, disposed on one side of the display screen away from a surface of the display screen for display, and located in a position corresponding to the fingerprint recognition area, to allow lights transmitted and received to pass through the fingerprint recognition area.

* * * * *